United States Patent
Anderle et al.

(10) Patent No.: US 6,242,053 B1
(45) Date of Patent: Jun. 5, 2001

(54) PROCESS FOR COATING PLASTIC CONTAINERS OR GLASS CONTAINERS BY MEANS OF A PCVD COATING PROCESS

(75) Inventors: Friedrich Anderle, Hanau; Jürgen Henrich, Limeshain; Wilfried Dicken, Wächtersbach; Heinrich Grünwald, Niddatal; Michael Liehr, Feldatal; Klaus Nauenburg; Rudolf Beckmann, both of Hanau, all of (DE)

(73) Assignee: Leybold Systems GmbH, Hanau (DE)

( * ) Notice: Subject to any disclaimer, the term of this patent is extended or adjusted under 35 U.S.C. 154(b) by 0 days.

(21) Appl. No.: 09/081,209

(22) Filed: May 20, 1998

(30) Foreign Application Priority Data

May 27, 1997 (DE) .............................................. 197 22 205

(51) Int. Cl.[7] ....................................................... C08F 2/46
(52) U.S. Cl. .......................... 427/488; 427/237; 427/238; 427/255.6; 427/491; 427/494; 427/496; 427/535; 427/536; 427/569

(58) Field of Search ..................................... 427/488, 491, 427/535, 536, 569, 238, 237, 255.6, 296, 294

(56) References Cited

U.S. PATENT DOCUMENTS 4,746,538 * 5/1988 Mackowski .
5,374,314 12/1994 Babacz ................................. 118/723

FOREIGN PATENT DOCUMENTS

| 0 503 820 A1 | 9/1992 | (EP) | .............................. C23C/16/44 |
| WO95/21948 | 8/1995 | (WO) | .............................. C23C/14/04 |
| WO95/22413 | 8/1995 | (WO) | .............................. B05D/7/24 |

* cited by examiner

*Primary Examiner*—Bernard Pianalto
(74) *Attorney, Agent, or Firm*—Smith, Gambrell & Russell, LLP

(57) ABSTRACT

A process and device is shown for coating the delineating surfaces of a hollow object, preferably a hollow object having at least one sealable opening, by means of plasma coating, via the action of plasma on the delineating surface of the hollow object that is to be coated.

2 Claims, 3 Drawing Sheets

PROCESS FOR COATING PLASTIC CONTAINERS OR GLASS CONTAINERS BY MEANS OF A PCVD COATING PROCESS

INTRODUCTION AND BACKGROUND

The present invention pertains to a container with a coating that inhibits the passage of gaseous and/or liquid substances through the walls of the container, a process for its preparation, and a device for implementing the process.

Containers for storing and conserving gaseous and/or liquid substances are known in the art. Such containers preferably consist of glass or sheet metal sections or plastics, whereby the latter have the advantage (relative to the aforementioned materials) of a distinctly lower weight as well as higher resistance to environmental effects. A disadvantageous feature in the case of such plastic containers has proven to be the fact that, with respect to the plastic materials that are currently used, gas exchange takes place via diffusion between the substance present in the container and the outside of the container. The reason for this is that the plastics that are used permit the diffusion of gases such as oxygen, carbon dioxide, or water vapor as well as other volatile substances such as fuels or fragrances and perfumes. The desired long-term stability of the substance in the container is also not guaranteed, especially with the currently available plastic containers.

In order to internally coat hollow containers, consisting of plastic or metal, with inert impermeable glass-like layers, the suggestion is made in WO 95/21948 that inorganic substances be evaporated under vacuum in the interior of the hollow container under the action of a plasma, whereby a certain degree of heating of the container walls by the plasma is desired for better adhesion. A disadvantageous feature is the high expense, in terms of apparatus, for the application and movement of the source for the evaporator.

Alternatively, it is suggested in WO 95/22413 that layers of the same type be prepared in the interior of hollow containers, consisting of plastic or metal, via plasma polymerization, whereby the process pressures inside and outside the container should be controlled independently of one another. The two aforementioned processes have the objective, in particular, of coating the interior of hollow containers, whereby this is less desirable in the case of medicine containers or foodstuffs containers since the reactive behavior of the layers prepared in this way is still almost unknown with respect to the most widely differing contents.

In U.S. Pat. No. 5,374,314, in contrast, a process is proposed for the external coating of hollow objects in which an electrical potential from an electrode, which is also arranged inside the hollow object, acts homogeneously on the interior of the hollow object by means of a first gas, which has been made electrically conductive, within the hollow object. As a result, a coating process is generated on the outside, which is assisted via the use of a second gas that contains charge carriers. However, a disadvantage is the expense, in terms of apparatus, for implementing the process, which is also considerable here.

It is therefore an object of the invention, is to have a container of this type with walls having a low permeability in comparison to known containers.

It is a further object of the invention to have a process for the preparation of such a container and a device for the implementation of the process.

SUMMARY OF THE INVENTION

In achieving the above and other objects, one feature of the invention resides in a container with at least one sealable opening and a layer, on the delineating surface of the container, that inhibits the passage of gaseous and liquid substances from the internal area of the container into the outer area and/or from the outer area into the inner area of the container, whereby the layer is prepared by means of a plasma-assisted coating process, preferably a plasma-chemical coating process, and whereby the layer is applied to the external surface of the container.

A further feature of the present invention resides in a container with at least one sealable opening and a layer, on the delineating surface of the container, that inhibits the passage of gaseous and liquid substances from the internal area of the container into the outer area and/or from the outer area into the inner area of the container, whereby the layer is prepared by means of a plasma-assisted coating process, preferably a plasma-chemical coating process, and whereby the layer is applied to the external surface of the container.

Yet another feature of the invention resides in a device for implementing the aforesaid process including a coating chamber capable of being evacuated and which has at least one sealable opening for bringing in and taking out the hollow object that is to be coated, at least one gas inlet for admitting process gas into the plasma process area and an antenna arrangement in order to feed electromagnetic radiation into the plasma process area by means of which the plasma gas is capable of being ignited and the plasma discharge is capable of being operated and whereby the internal area of the container is preferably capable of being sealed off by sealing elements in a gastight manner relative to the external area of the container.

BRIEF DESCRIPTION OF DRAWINGS

The present invention will be further understood with reference to the drawings, wherein.

DETAILED DESCRIPTION OF INVENTION

Figure 1:
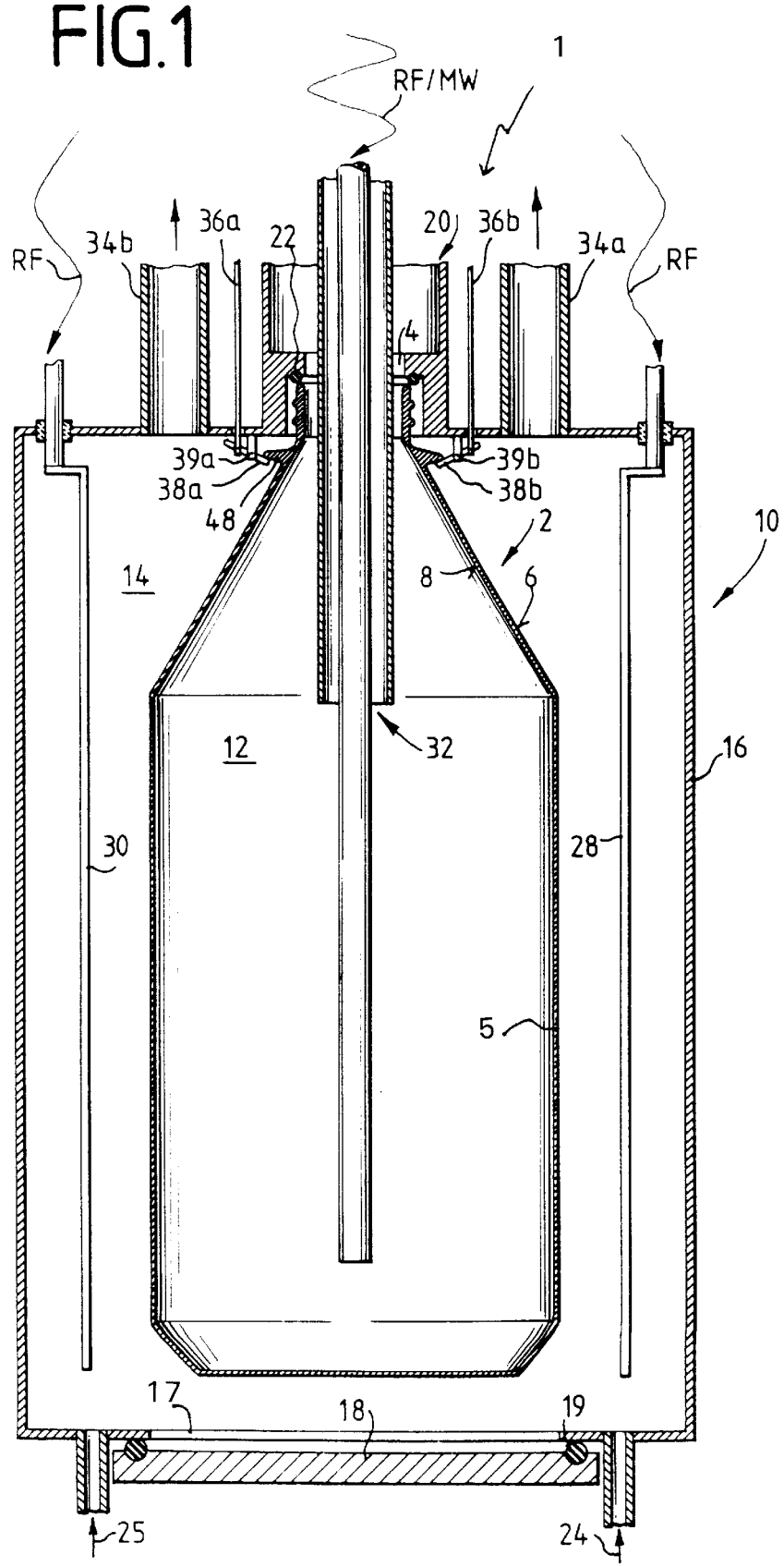
FIG. 1 shows, in the form of a longitudinal section, a coating device in accordance with the invention for depositing PCVD layers on container surfaces in accordance with a first embodiment of the invention.

According to the present invention, the feature is provided that the container walls, preferably the outer walls of the container, are coated by means of a plasma-assisted coating process, preferably a PCVD process. For this purpose, the hollow object, which has at least one opening, is brought into a coating chamber and the external delineating or boundary surface to be coated is sealed off in a vacuum tight manner from the inner walls of the hollow object. The outside of the container is externally delineated from the walls of the coating chamber. After evacuation of the coating chamber, a plasma process gas is released on the outside of the container via gas inlets, whereby the plasma process gas is transformed into the plasma state by means of electromagnetic radiation fed to the outside of the container via antennae. During the entire coating time, a gas pressure prevails inside the container, which prevents plasma ignition. As a result, only the external container walls are selectively and advantageously covered with a PCVD-deposited layer. During the major part of the process time, the pressure within the container is higher than that outside of the container and preferably amounts to 900–1100 mbar. The pressure outside the container amounts to between 0.005 mbar and 50 mbar, preferably 0.05–10 mbar. The plasma outside the container can also be produced, for example, by feeding microwave power into the plasma process area and maintaining such for a prescribed time. The preferred microwave frequency for this purpose amounts to 2.45 GHz.

In this connection, a pronounced radially symmetrical distribution of the electrical field of the microwave power fed in is advantageous for achieving a uniform coating. A waveguide is provided, for example, for feeding in microwave power, whereby the waveguide consists of a tubular or rod-like internal conductor and a metal cylinder arranged coaxially relative to this. For this purpose, it is suggested that the external conductor of the waveguide itself also be arranged outside the hollow object.

Moreover, as an alternative, the situation is provided that the microwaves irradiate outward from an antenna device arranged outside the container—preferably from a Lisitano antenna that is known from the literature—and in the direction of the external walls of the hollow object. A preferably non-resonant mode of operation is provided in all the designated microwave arrangements. If required, a resonant microwave mode of operation is capable of being set up by varying the length of the coating chamber.

It has also proven advantageous to feed in the microwave power in a pulsed manner and/or to feed electromagnetic radiation into the plasma process area with a frequency of 10–450 kHz in the form of a dipole field, a quadrupole field, or an octapole field in addition to the feeding in of microwave power.

In order to avoid thermally produced deformation or other impairment of the containers during the time of coating, these are cooled by a medium admitted into the interior of the container. For this purpose, a gaseous cooling medium, preferably air, is admitted into the interior of the container, whereby the microwave antenna or the radio wave antenna serve as the inlet for the cooling medium. Alternatively, the situation is provided in which the cooling medium consists of an essentially nonpolar liquid that does not absorb microwave power and radio waves. In the case of feeding in radio waves in the MHz or KHz range by means of antennae arranged outside the container, the cooling liquid can also contain certain amounts of water.

In order to detach the coated container from the coating device after ventilating the coating chamber, a short gas-pressure pulse is introduced into the hollow object via its opening; as a result, the hollow object is detached without difficulty from the coating device. In order to support the hollow object in terms of preventing deformation during the time of coating, supporting elements are provided inside the coating chamber by means of which the hollow object is held in a manner that is stable in regard to shape.

When feeding radio waves into the plasma process area from an antenna arranged inside the container, these have a frequency of 13.56 MHz or a multiple thereof.

Radio waves that are fed in from outside the container are fed in via an electrode arrangement arranged outside the hollow object. Radio waves that are fed in from outside have a frequency of 10–450 kHz, preferably 30–450 kHz, 13.56 MHz, or a multiple thereof. In the case of using a frequency in the MHz range, a coil wound around the container is proposed for feeding in the radiation.

Tetraethoxysilane, tetramethoxysilane, or mixtures that contain these substances is provided as the layer-forming process gas. Alternatively, tetraisopropoxy orthotitanate or mixtures that contain this substance is/are provided as the layer-forming gas. In addition, the following are alternatively proposed as the layer-forming gases: tetramethyldisiloxane, vinyltrimethoxysilane, vinyltrimethylsilane, octamethylcyclotetrasiloxane, divinyl-tetramethyldisiloxane, or mixtures that contain these substances. The layers that are to be separated or that have been separated are layers that are low in carbon and that in essence contain silicon and oxygen or layers that are rich in carbon, silicone-like, and comprise one of the aforementioned gas mixtures.

In addition, a variation of the present invention is provided that the layers prepared can be treated by a subsequently applied plasma into which at least one hydroxy compound, preferably ethanol or methanol, has been introduced. The surface of the separated layer is modified to a layer depth down to 2–3 nm by the plasma containing the hydroxy compound.

The invention will be illustrated in detail on the basis of especially preferred examples of embodiments that are illustrated in the accompanying figures.

A coating device 1 is illustrated in FIG. 1, by means of which the external surfaces 6 of a container 2 having an opening 4, is to be coated by a plasma-assisted PCVD process. The coating device 1 comprises a coating chamber 10 capable of being evacuated via pump connections 34a, 34b, which are introduced into the chamber wall 16, and by vacuum pumps that are not illustrated in FIG. 1. In order to supply the coating chamber 10 with the container 2, the coating chamber has an opening 17 that is capable of being sealed by cover 18, which fits snugly onto sealing elements 19 on the chamber wall 16 and which seal off the coating chamber 10 in a vacuum-tight manner.

In order to coat the external surface 6 of the container 2, the container is introduced into the coating chamber 10 via the opening 17 and the coating chamber 10 is then sealed in a vacuum-tight manner using the cover 18. The container 2 is constructed conically at the end with the opening and has an opening 4 at the terminal side with an external screw thread 50 (see FIG. 2). On the front, the container 2 is arranged on a sealing head 20 by means of its opening 4 and fits snugly and peripherally against a sealing element 22 via its front sealing surface 52. In order to ensure a vacuum-tight transition to the inner area 12 of the container relative to the inner area of the coating chamber 10, the container 2 is pressed against the sealing element 22 by a sealing force exerted on the collar 48 that is molded, preferably peripherally, onto the container 2.

In order to ignite the plasma in the outside area 14 of the container, a process gas is admitted into this area via gas inlets 24, 25 (see FIG. 1), whereby one adjusts the gas pressure required for igniting the plasma gas and operating the plasma. In order to ignite the plasma, electromagnetic radiation is admitted via the antennae 28, 30 arranged to project into the plasma process area 14 and which are electrically insulated from the chamber walls 16. A certain gas pressure is set up in the internal area 12 of the container, whereby this pressure lies outside the ignition pressure range of the gas located in said internal area 12 of the container. As a result, the situation is brought about that the plasma is ignited exclusively in the outside area 14 of the container and the plasma-assisted, plasma-chemical layer deposition process takes place exclusively on the outer surface 6 of the container 2.

Alternatively or additionally to the antennae 28, 30, a waveguide arrangement 32 is provided, which projects essentially coaxially through the container opening 4 and into the internal area 12 of the container 2. The electromagnetic energy required for the ignition and operation of the plasma can be supplied to the plasma process area 14 in the form of microwaves by means of the waveguide 32. The microwave frequency in this case lies in the GHz range and usually amounts to 2.45 GHz.

In order to cool the container wall 5, which is heated during the coating process, a cooling gas is admitted into the internal area 12 of the container via the coaxially constructed waveguide 32; as result, thermally produced deformation of the container 2 is prevented by the pressure difference that prevails between the internal area 12 of the container and the external area 14 of the container.

After coating has taken place, the plasma area 14 is ventilated via the gas inlets 24, 25 and the container 2 is taken out through the opening 17.

Figure 2:
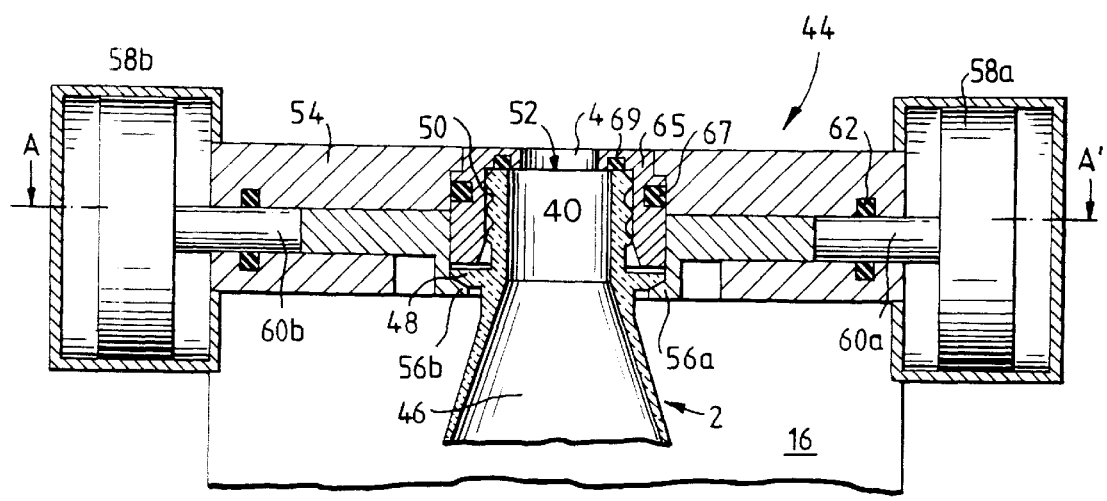
FIG. 2 shows a cross-sectional view of a sealing cap of a coating device in accordance with a second embodiment of the invention.
Figure 3:
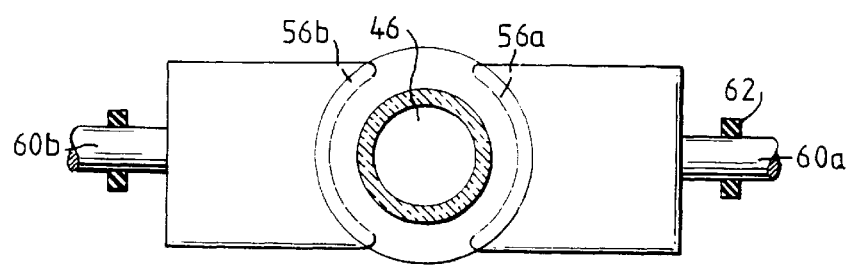
FIG. 3 shows a plane view onto the sectional plane A—A—' drawn in FIG. 2.

A sealing cap 44 for sealing the container 2 is illustrated in FIG. 2 in accordance with a second example of an embodiment of the invention. In order to seal the container 2 to the coating device during the coating process, the container head 40 is inserted, via its external screw thread 50, into an insert 65 arranged in the head 54 of the coating device. In order to tightly seal off the internal area 12 of the container relative to the external area 14 of the container, the container 2 is pressed—by means of two sliders 56a, 56b that can be displaced relative to one another and that are arranged diametrically opposite one another—against the insert 65 via the front peripheral sealing surface 52, whereby the sliders 56a, 56b slide against the oblique lower surface of the container collar 48, and with the collar, together with the container 2, being displaced in a preferential direction in the direction of the head component 54. In this connection, the sealing surface 52 is pressed against the peripheral sealing element 69 in a vacuum-tight manner, whereby the sealing element is placed in a circular grove in the insert 65. In this connection, the sliders 56a, 56b are each moved counter to one another by means of compressed-air cylinders 58a, 58b. In order to detach the container 2 from the sealing cap 44, the sliders 56a, 56b are driven away from the container 2; as a result, the container 2 disengages from the insert 65 without further action being taken. In order to detach the container 2, the separation of the container 2 from the head 54 can be accelerated via a pressure thrust directed toward the opening 4.

Figure 4A:
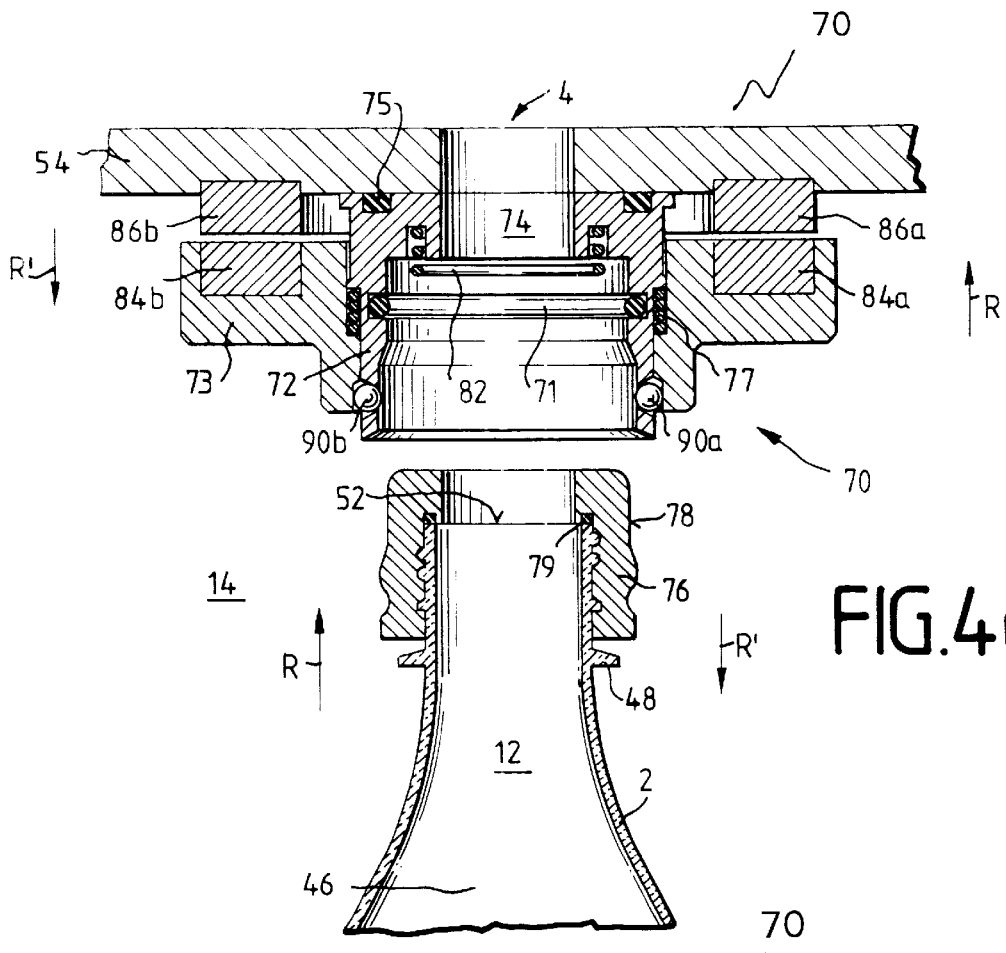
FIG. 4a shows a third example of an embodiment of a sealing cap in its released position for a coating device in accordance with the invention.
Figure 4B:
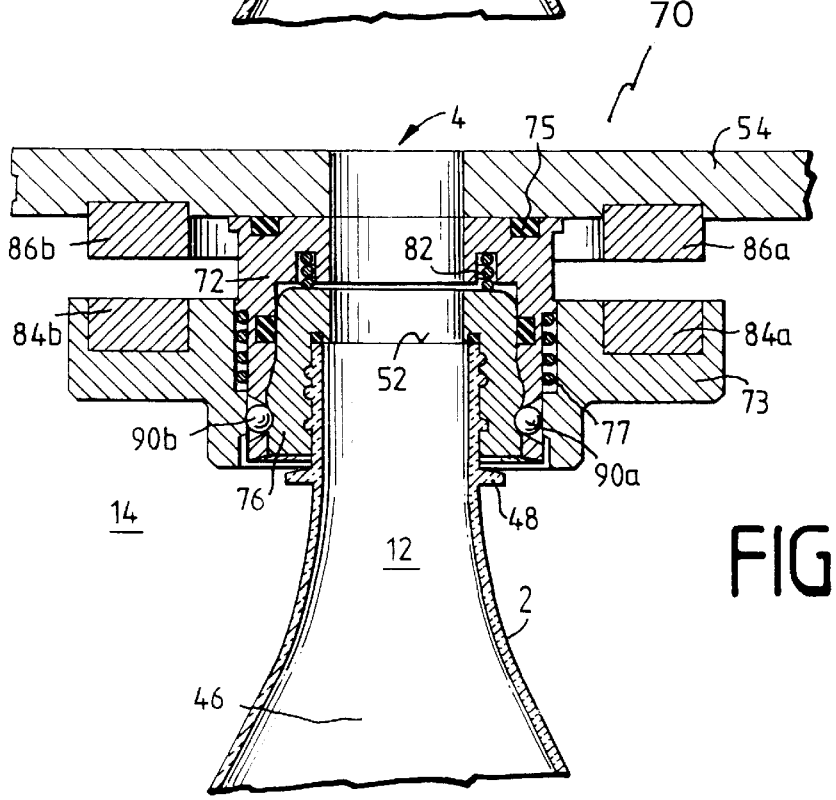
FIG. 4b shows the sealing cap, which is shown in FIG. 4a, in the sealed position.

A further sealing cap 70 is illustrated in FIGS. 4a and 4b, namely in the sealing position. (FIG. 4b) and the introduction or removal position (FIG. 4a). The sealing cap 70 consists, in essence, of an adaptor accommodation unit 72 arranged in a stationary manner on the head component 54. The adaptor accommodation unit 72 has a passageway opening 74 essentially arranged contiguously with respect to the opening 4 introduced into the head component 54. In order to seal a container 2, which is to be coated, an adaptor 76 is screwed down onto the container head 40 via the external screw thread 50 of the container 2. The adaptor 76 with a peripheral sealing element 79 is located at the front on the front sealing surface 52 of the container 2 (see FIG. 4a). The container 2, together with the attached adaptor 76, is inserted into the adaptor accommodation unit in the loading direction R, which is illustrated in FIG. 4a, by means of transport devices, which are not illustrated in the drawings, whereby the adaptor 76 compresses—via its front surface—a ring-shaped spring introduced into the adaptor accommodation unit 72 into its final position. The external jacket surface of the adaptor 76 fits snugly onto a peripheral sealing element 71 fixed in a groove in the adaptor accommodation unit 72. Since the adaptor accommodation unit 72 simultaneously fits snugly against the sealing element, which surrounds the opening 4, the external area 14 of the container is completely separated in a sealed off manner from the internal area 12 of the container.

In order to seal off the container 2 in relation to the head component 54, a sealing ring 73, which surrounds the adaptor accommodation unit 72 and which is mounted axially thereon in a displaceable way, moves away from the head component 54 by means of an electromagnetically exerted force as illustrated in FIG. 4b. For this purpose, magnetic elements 84a, 84b, e.g., permanent magnets, are inserted into the sealing ring 73, whereby the permanent magnets can be positioned in collaboration with the electromagnets 86a, 86b arranged in the head component 54. In their sealing position, illustrated in FIG. 4b, the electromagnets 86a and 86b are activated in such a way that the sealing ring 73 is held—with assistance from the spring 77 arranged between the sealing ring 73 and the adaptor accommodation unit 72—in the sealing position shown in FIG. 4b. As a result, blocking spheres 90a, 90b arranged in ball bearings in the adaptor accommodation unit 76 are pressed into the channels formed in the adaptor 76, and seal the adaptor 76 in the adapter accommodation unit 72. The external area of the container is then evacuated as described above, whereby the internal area 12 of the container has a cooling medium flowing through it.

After the process of coating the container 2 has taken place, the adaptor 76 is unbolted by a movement of the sealing ring 73 directed toward the head component 54. The unbolted adaptor is pressed out of the adaptor accommodation unit 72 by the pretensioned spring 82 in order to be transported further. The detachment of the container 2 from the sealing cap 70 can be assisted in this regard via a pulse of gas pressure through the openings 4, 74 and into the internal area 12 of the container. In the unbolted position, the electromagnets 86a and 86b are activated in such a way that an attractive electromagnetic force is exerted between the permanent magnets 84a or 84b and the electromagnets 86a on the one hand, and 86b on the other hand.

Further variations and modifications will be apparent to those skilled in the art from the foregoing and are intended to be encompassed by the claims appended hereto.

German priority application 197 22 205.6 is relied on and incorporated herein by reference.

We claim:

1. A process for coating the outer surface of a hollow object by means of plasma coating, via the action of plasma on the outer surface of the hollow object that is to be coated, comprising:
   a) introducing the hollow object to be coated into a coating chamber which is capable of being evacuated;
   b) sealing, then evacuating the coating chamber;
   c) admitting a plasma process gas or a process gas mixture into a plasma process area within said coating chamber, wherein a gas pressure provided for igniting and operating the plasma is set up for carrying out coating in the region of the outer surface that is to be coated, while a gas pressure inside said hollow object is controlled so that plasma ignition is prevented, wherein the pressure within the hollow object is in the range of 900–1100 mbar and the pressure in said plasma process area is in the range of 0.005–50 mbar;

d) igniting the plasma and maintaining the plasma discharge by feeding electromagnetic radiation into the plasma process area for a predetermined period of time, to thereby deposit a polymer layer on a surface of said hollow object that is to be coated, wherein the polymer layer inhibits the passage through a wall of said hollow object of gaseous and/or liquid substances that are to be introduced into said hollow object; and e) switching off the electromagnetic radiation, then ventilating the coating chamber in order to remove the hollow object which has been coated with said polymer layer.

2. A process according to claim 1 wherein said hollow object has at least one sealable opening.

\* \* \* \* \*